United States Patent
Akahane

(10) Patent No.: US 12,078,663 B2
(45) Date of Patent: Sep. 3, 2024

(54) OVERCURRENT DETECTION CIRCUIT AND DRIVE CIRCUIT

(71) Applicant: FUJI ELECTRIC CO., LTD., Kanagawa (JP)

(72) Inventor: Masashi Akahane, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 195 days.

(21) Appl. No.: 17/890,251

(22) Filed: Aug. 17, 2022

(65) Prior Publication Data

US 2022/0390492 A1    Dec. 8, 2022

Related U.S. Application Data

(63) Continuation of application No. PCT/JP2021/028166, filed on Jul. 29, 2021.

(30) Foreign Application Priority Data

Sep. 11, 2020    (JP) .................................. 2020-152961

(51) Int. Cl.
*G01R 19/165* (2006.01)
*H03K 17/082* (2006.01)

(52) U.S. Cl.
CPC . *G01R 19/16571* (2013.01); *G01R 19/16576* (2013.01); *H03K 17/082* (2013.01)

(58) Field of Classification Search
CPC ........ H02M 1/32; H02M 1/0009; H02M 1/08; G01R 19/16576; G01R 19/16571; H03K 17/0828; H03K 17/082

(Continued)

(56) References Cited

U.S. PATENT DOCUMENTS 5,375,029 A    12/1994 Fukunaga
2018/0316182 A1*    11/2018 Minagawa ......... H03K 17/0828

(Continued)

FOREIGN PATENT DOCUMENTS

EP    2899886 A1    7/2015
JP    H06120787 A    4/1994

(Continued)

OTHER PUBLICATIONS

International Search Report and (ISA/237) Written Opinion of the International Search Authority for International Patent Application No. PCT/JP2021/028166, mailed by the Japan Patent Office on Oct. 5, 2021.

*Primary Examiner* — Kevin J Comber

(57) ABSTRACT

Provided is an overcurrent detection circuit for detecting an overcurrent flowing upon turning on of a switching element, the overcurrent detection circuit including a main current detection unit configured to detect whether an input signal according to a main current is higher than or equal to a set detection threshold, and a condition control unit configured to control at least one of a waveform of the input signal in the main current detection unit or the detection threshold to control a comparison condition in the main current detection unit, in which the condition control unit is configured to set the comparison condition to a first condition during a period from the turning on of the switching element until elapse of a first period, and set the comparison condition to a second condition during a period from the elapse of the first period until elapse of a second period.

17 Claims, 16 Drawing Sheets

(58) Field of Classification Search
USPC .......................................................... 361/93.1
See application file for complete search history.

(56) References Cited

U.S. PATENT DOCUMENTS

2019/0187190 A1* 6/2019 Akahane .......... G01R 19/16571
2020/0036374 A1* 1/2020 Akahane ............ H03K 17/0828

FOREIGN PATENT DOCUMENTS

| | | |
|---|---|---|
| JP | 2006032393 A | 2/2006 |
| JP | 2015053749 A | 3/2015 |
| JP | 2015139271 A | 7/2015 |
| JP | 2018186691 A | 11/2018 |
| JP | 2019110486 A | 7/2019 |
| WO | 2019077895 A1 | 4/2019 |

* cited by examiner

OVERCURRENT DETECTION CIRCUIT AND DRIVE CIRCUIT

The contents of the following Japanese and PCT patent applications are incorporated herein by reference:
NO. 2020-152961 filed in JP on Sep. 11, 2020
NO. PCT/JP2021/028166 filed in WO on Jul. 29, 2021

BACKGROUND

1. Technical Field

The present invention relates to an overcurrent detection circuit and a drive circuit.

2. Related Art

A drive circuit configured to control a switching element such as a transistor has been known (for example, see Patent documents 1 to 5).
Patent document 1: Japanese Patent Application Publication No. 2006-32393
Patent document 2: Japanese Patent Application Publication No. 2015-53749
Patent document 3: Japanese Patent Application Publication No. 2015-139271
Patent document 4: Japanese Patent Application Publication No. H6-120787
Patent document 5: International Publication No. 2019/077895

DESCRIPTION OF EXEMPLARY EMBODIMENTS

Hereinafter, the present invention will be described through embodiments of the invention, but the following embodiments do not limit the present invention according to the claims. In addition, not all combinations of the features described in the embodiments necessarily have to be essential to solving means of the invention. Note that in the present specification and drawings, an element substantially having a same functional and configuration is assigned with a same reference sign, and duplicated descriptions will be omitted, or an illustration of an element that is not directly related to the present invention will be omitted. In addition, in one drawing, with regard to elements having a same functional and configuration, a representative element is assigned with a reference sign, and reference signs for other elements may be omitted.

In the present specification, when a word "same" or "equal" is used, a case of having an error due to production tolerances or the like may also be included. The error is, for example, within 10%.

Figure 1:
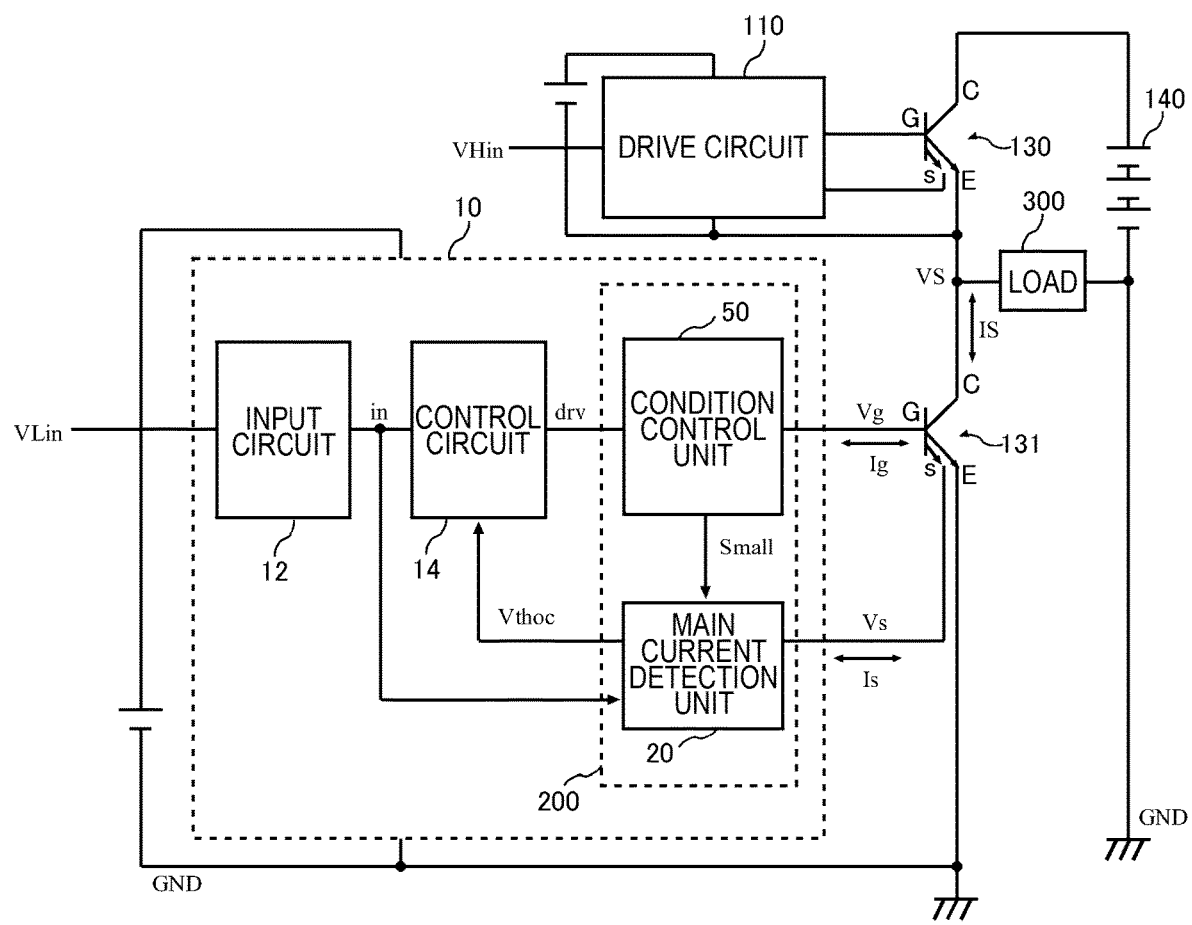
FIG. 1 illustrates an example of a power supply circuit 100 according to an embodiment of the present invention.

FIG. 1 illustrates an example of a power supply circuit 100 according to an embodiment of the present invention. The power supply circuit 100 is configured to supply electrical power to a load 300. The power supply circuit 100 of the present example includes a switching element 130, a switching element 131, a drive circuit 110. a drive circuit 10, and a power source 140.

The switching element 130 and the switching element 131 are transistors such as an insulated gate bipolar transistor (IGBT) as an example, but are not limited to this. Each of the switching elements may have a gate terminal G, a collector terminal C, an emitter terminal E, and a current sense terminal s.

The switching element 130 and the switching element 131 of the present example are connect in series. The power source 140 is configured to supply power source electrical power to the switching element 130 and the switching element 131 which are connected in series. In the present example, the collector terminal of the switching element 130 is connected to a high voltage terminal of the power source 140, and the collector terminal of the switching element 131 is connected to the emitter terminal of the switching element 130. In addition, the emitter terminal of the switching element 131 is connected to a reference potential (in the present example, a ground potential GND).

The power supply circuit 100 is configured to supply electrical power to the load 300 from a connection point of the switching element 130 and the switching element 131. On and off states of the switching element 130 and the switching element 131 are mutually complementarily switched. That is, when one switching element is in an on state, the other switching element is controlled into an off state. As a result, switching is performed on whether the load 300 is to be connected to the high voltage terminal of the power source 140 or connected to the reference potential.

The drive circuit 110 is configured to switch an on state or an off state by controlling the switching element 130. The drive circuit 110 of the present example generates a control signal to be input to the gate terminal G of the switching element 130. The drive circuit 110 may have a configuration similar to the drive circuit 10. In FIG. 1, a specific configuration of the drive circuit 110 is omitted.

The drive circuit 10 is configured to switch the on state and the off state by controlling the switching element 131.

The drive circuit 10 of the present example generates a control signal to be input to the gate terminal G of the switching element 131.

The drive circuit 10 has an input circuit 12, a control circuit 14, and an overcurrent detection circuit 200. A first control signal VLin indicating whether the switching element 131 is to be controlled into either the on state or the off state is input to the input circuit 12. For example, the first control signal VLin is a signal indicating a logical value according to the on state or the off state.

The input circuit 12 is configured to generate and output a second control signal "in" based on the first control signal VLin. For example, the input circuit 12 generates the second control signal in by sampling a waveform of the first control signal VLin at a predetermined cycle.

The control circuit 14 is configured to generate and output a drive signal dry based on the second control signal in. The drive signal dry is a signal at a voltage higher than or equal to a threshold voltage of the switching element 131 during a period in which the switching element 131 is to be put into the on state and at a voltage lower than the threshold voltage during a period in which the switching element 131 is to be put into the off state. A gate voltage Vg according to the drive signal dry is applied to the gate terminal G of the switching element 131. The control circuit 14 supplies, to the switching element 131, a gate current Ig for charging and discharging a parasitic capacitance at the gate terminal G or the like of the switching element 131.

The overcurrent detection circuit 200 is configured to detect whether an excessive main current IS is flowing in the switching element 131. The main current IS is current flowing in the load 300. The main current IS of the present example is a collector current of the switching element 131. The overcurrent detection circuit 200 may detect a sense current Is flowing in the current sense terminal s of the switching element 131. For example, the sense current Is is a current lower than the main current IS and also proportional to the main current IS. The sense current Is may be a current value at $\frac{1}{100}$ or less of the main current IS. The current value of the main current IS can be estimated by detecting the current value of the sense current Is. The overcurrent detection circuit 200 may detect whether the overcurrent is flowing in the switching element 131 when the switching element 131 turns on, that is, upon transition from the off state to the on state.

When it is determined that the overcurrent is flowing in the switching element 131, the overcurrent detection circuit 200 may input a cutoff signal Vthoc for putting the switching element 131 into the off state to the control circuit 14. As a result, the switching element 131 and other circuits can be protected. In addition, when it is determined that the overcurrent is flowing in the switching element 131, the overcurrent detection circuit 200 may notify an external circuit of that effect.

The overcurrent detection circuit 200 has a condition control unit 50 and a main current detection unit 20. An input signal according to the main current IS flowing in the switching element 131 is input to the main current detection unit 20. The input signal of the present example is a signal according to the sense current Is or a sense voltage Vs. Note that the sense voltage Vs is a signal obtained by converting the sense current Is into a voltage. For example, the sense current Is can be converted into a voltage signal by causing the sense current Is to flow in a predetermined resistor. In the present specification, descriptions will be provided where the sense voltage Vs is set as an input signal Vs. The main current detection unit 20 is configured to detect whether a value of the input signal Vs is higher than or equal to a set detection threshold. As a result, it is possible to detect whether the overcurrent is flowing in the switching element 131.

The condition control unit 50 is configured to control a comparison condition in the main current detection unit 20 by controlling at least one of a waveform of the input signal Vs in the main current detection unit 20 or the detection threshold. The condition control unit 50 of the present example inputs a condition control signal Small for controlling the comparison condition to the main current detection unit 20. By controlling the comparison condition, the value of the input signal Vs can be more likely or less likely to be higher than or equal to the detection threshold. For example, by increasing the detection threshold or decreasing an amplitude of the input signal Vs, the value of the input signal Vs is less likely to be higher than or equal to the detection threshold. In addition, by decreasing the detection threshold or increasing the amplitude of the input signal Vs, the value of the input signal Vs is more likely to be higher than or equal to the detection threshold. That is, the condition control unit 50 adjusts a sensitivity for the main current detection unit 20 to detect the overcurrent.

The condition control unit 50 of the present example changes the comparison condition in the main current detection unit 20 for every predetermined period after turning on of the switching element 131. As a result, whether the overcurrent is flowing in the switching element 131 is accurately detected.

Figure 2:
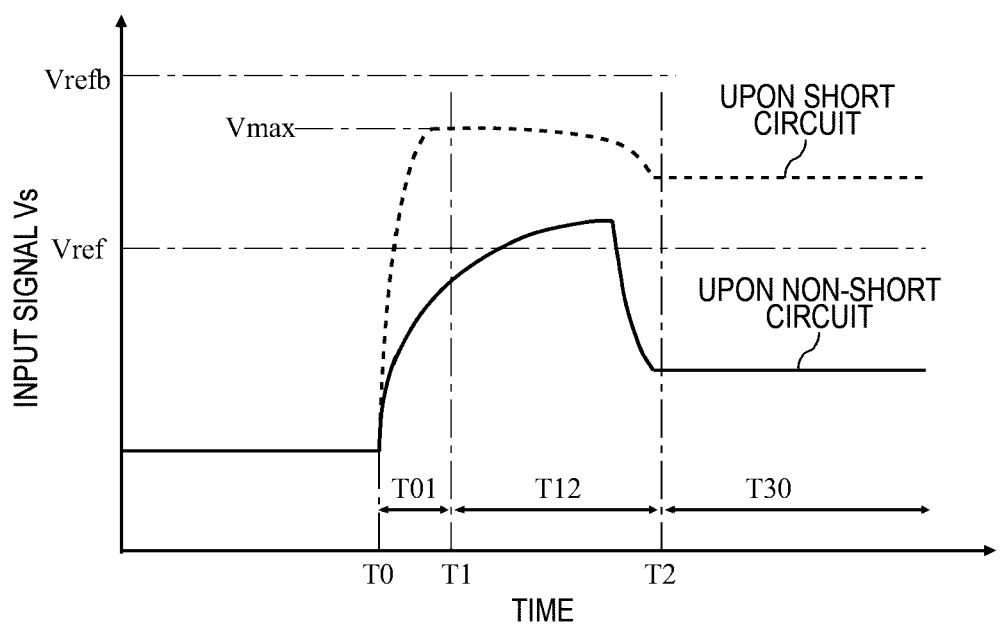
FIG. 2 illustrates a waveform of an input signal Vs and a detection threshold Vref in a comparative example

FIG. 2 illustrates a waveform of the input signal Vs and a detection threshold Vref in a comparative example. In FIG. 2, a waveform of the input signal Vs upon non-short circuit of the switching element 131 is represented by a solid line, and a waveform of the input signal Vs upon short circuit is represented by a broken line. Note that short circuit refers to a state in which, for example, the switching element 130 and the switching element 131 are simultaneously put into the on state, so that a large current is applied between the collector emitter terminals of the switching element 131.

When the predetermined gate voltage Vg is applied to the gate terminal G of the switching element 131, the switching element 131 turns on. In FIG. 2, a clock time at which the switching element 131 has turned on is set as T0. Immediately after the turning on of the switching element 131, the large main current IS instantaneously flows in the switching element 131. For this reason, the input signal Vs is instantaneously set to have a large value. After elapse of a predetermined period from the turning on, the main current IS converges to a predetermined value, and the input signal Vs also converges to a predetermined value. In the present specification, a period from the turning on of the switching element 131 to the convergence of the input signal Vs to the predetermined value may be referred to as a transient period. In the example of FIG. 2, a period from the clock time T0 to a clock time T2 is the transient period. In addition, a period after the convergence of the input signal Vs to the predetermined value may be referred to as a steady state period. In the example of FIG. 2, a period at and after the clock time T2 is the steady state period.

During the transient period, since the large main current IS instantaneously flows in the normal switching element 131 too (for example, the switching element 131 in a non-short circuit state, the input signal Vs is more likely to exceed the detection threshold Vref. For this reason, during the transient period, when the overcurrent is detected under the same comparison condition as that for the steady state period, even the normal switching element 131 may detect the overcurrent.

To deal with this, it is conceivable to set a comparison condition under which the overcurrent is less likely to be detected during the transient period as compared with the steady state period. For example, it is conceivable to set a detection threshold Vrefb for the transient period to be higher than the detection threshold Vref for the steady state period. As a result, it is possible to suppress erroneous detection of the overcurrent for the normal switching element 131.

On the other hand, when a detection sensitivity of the overcurrent during the transient period is decreased, it is less likely to detect that the switching element 131 is in a short circuit state. For example, when the detection threshold Vrefb is higher than a transient current flowing in the switching element 131 in a short circuit state, it is not possible to detect the short circuit state during the transient period. For this reason, timing for cutting off the switching element 131 is delayed, and there may be a case where it is not possible to appropriately protect the switching element 131.

Figure 3:
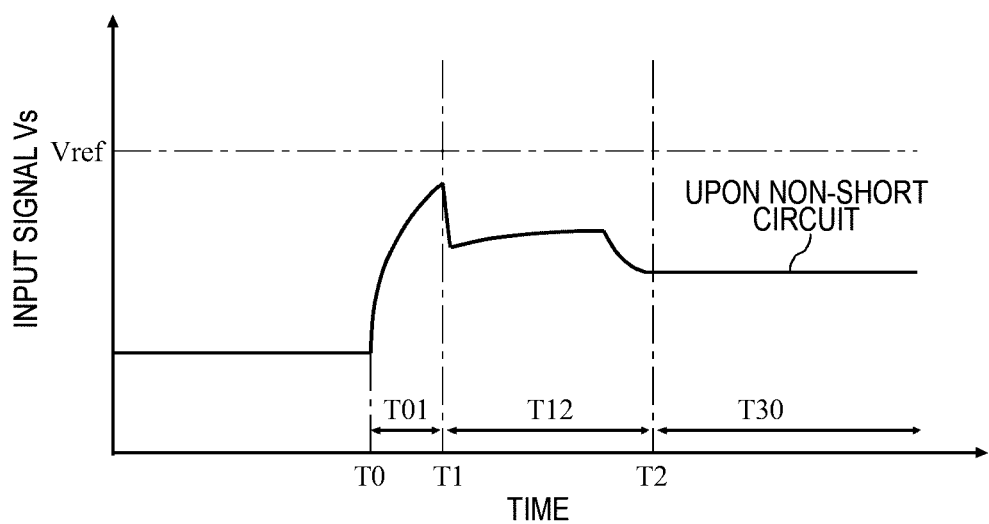
FIG. 3 is a diagram for describing an operation example of a condition control unit 50.

FIG. 3 is a diagram for describing an operation of the condition control unit 50 according to an embodiment. The condition control unit 50 sets the comparison condition to a first condition until elapse of a first period T01 (a period from T0 to T1 in the example of FIG. 3) since the turning on of the switching element 131. In addition, the condition control unit 50 sets the comparison condition to a second condition until elapse of a second period T12 (a period from T1 to T2 in the example of FIG. 3) since the elapse of the first period T01. The second condition is a condition under which the input signal Vs is less likely to be higher than or equal to the detection threshold Vref as compared with the first condition.

In the example of FIG. 3, the condition control unit 50 sets the amplitude of the input signal Vs during the second period T12 to be lower than the amplitude of the input signal Vs during the first period T01. The amplitude of the input signal Vs may be a gain used to convert the sense current Is into the sense voltage Vs. More specifically, by adjusting a resistance value of a resistor in which the sense current Is is caused to flow, the gain (that is, the amplitude) of the sense voltage Vs (the input signal Vs) can be adjusted. The condition control unit 50 may adjust the amplitude of the input signal Vs such that a maximum value of the input signal Vs during the second period T12 of the normal switching element 131 is higher than or equal to 70% and also lower than or equal to 90% of the detection threshold Vref. The amplitude of the input signal Vs during the second period T12 may be higher than or equal to 50% of the amplitude of the input signal Vs during the first period T01.

In the present example, the detection sensitivity of the overcurrent is relatively decreased during the second period T12. As a result, the erroneous detection of the overcurrent during the second period T12 can be suppressed. In addition, the detection sensitivity of the overcurrent is relatively increased during the first period T01. As a result, the overcurrent can be detected at a high sensitivity during the first period T01 immediately after the turning on of the switching element 131. When the switching element 131 is in a short circuit state, a large current is applied to the switching element 131. For this reason, as illustrated in FIG. 2, immediately after the turning on of the switching element 131, the input signal Vs abruptly rises. In the present example, since the detection sensitivity of the overcurrent during the first period T01 immediately after the turning on is high, the overcurrent in a short circuit state is more likely to be detected.

The first period T01 is preferably longer than or equal to a time period from the turning on of the switching element 131 that has been put into a short circuit state until the input signal Vs reaches the detection threshold Vref under the first condition. The first period T01 may be longer than or equal to a time period from the turning on of the switching element 131 that has been put into short circuit state until the input signal Vs reaches a maximum value Vmax. As a result, the overcurrent in a short circuit state is further more likely to be detected.

The second period T12 preferably continues up to timing (the clock time T2 in the example of FIG. 3) at which a control current flowing in the switching element 131 that is not in a short circuit state converges to a steady state value or later than the timing. As a result, the erroneous detection of the overcurrent during the second period T12 can be further suppressed. The second period T12 may be longer than the first period T01. The second period T12 may be twice or more, may be five times or more, or may be ten times or more as long as the first period T01. As an example, the first period T01 is longer than or equal to 500 ns and also shorter than or equal to 2 μs, and the second period T12 is longer than or equal to 2 μs and also shorter than or equal to 10 μs.

During a third period T30 after the elapse of the second period T12, the condition control unit 50 sets the comparison condition in the main current detection unit 20 to a third condition under which the input signal Vs is more likely to be higher than or equal to the detection threshold Vref as compared with the second condition. The third period T30 in the present example is the steady state period. That is, the condition control unit 50 sets the sensitivity of the overcurrent detection during the third period T30 to be higher than the sensitivity of the overcurrent detection during the second period T12. As a result, while the erroneous detection of the overcurrent during the second period T12 corresponding to the transient period is suppressed, the overcurrent during the third period T30 can be accurately detected.

In the present example, the detection threshold Vref may be the same in each period. The detection threshold Vref is lower than the maximum value Vmax of the input signal Vs upon short circuit of the switching element 131. In addition, the detection threshold Vref may be higher than the maximum value during the second period of the input signal Vs under the second condition of the switching element 131. In addition, the detection threshold Vref is higher than the steady state value of the input signal Vs under the third condition of the switching element 131 during the third period.

The third condition may be a same condition as the first condition. In this case, the resistor configured to convert the sense current Is into the sense voltage Vs can be commonly used under the first condition and the third condition. In another example, the third condition may be different from the first condition. As an example, the first condition may be a condition under which the input signal Vs is more likely to be higher than or equal to the detection threshold Vref as compared with the third condition. That is, the sensitivity of the overcurrent detection during the first period T01 may be higher than the sensitivity of the overcurrent detection during the third period T30. As a result, the overcurrent in a short circuit state can be accurately detected, and the switching element 131 in a short circuit state and other circuits are more likely to be protected.

Figure 4:
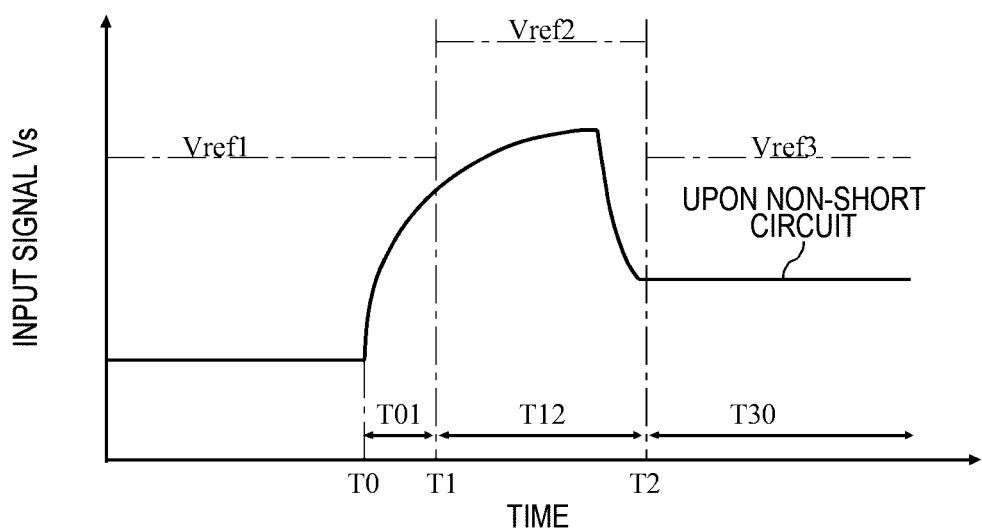
FIG. 4 is a diagram for describing another operation example of the condition control unit 50.

FIG. 4 is a diagram for describing another operation example of the condition control unit 50. The condition control unit 50 of the present example sequentially changes the comparison condition in each period to the first condition, the second condition, or the third condition by changing the detection threshold Vref in each period.

The condition control unit 50 of the present example sets the detection threshold during the first period T01 to Vref1. The detection threshold Vref1 is lower than the maximum value Vmax of the input signal Vs upon short circuit of the switching element 131.

Next, the condition control unit 50 sets the detection threshold during the second period T12 to Vref2 that is higher than Vref1. The detection threshold Vref2 may be higher than the maximum value during the second period of the input signal Vs under the second condition of the normal switching element 131.

Next, the condition control unit 50 sets the detection threshold during the third period T30 to Vref3 that is lower than Vref2. The detection threshold Vref3 is higher than the steady state value of the input signal Vs under the third condition of the normal switching element 131 during the third period. In this manner, the detection sensitivity of the overcurrent during each period can be also adjusted by adjusting the detection threshold Vref. The detection threshold Vref3 may be the same as or may be different from the detection threshold Vref1. As an example, the detection threshold Vref1 may be lower than the detection threshold Vref3. In this case, the overcurrent in a short circuit state can be accurately detected, and the switching element 131 in a short circuit state and other circuits are more likely to be protected.

A configuration may be adopted where the condition control unit 50 of the present example does not adjust the amplitude of the input signal Vs during each period. That is, the gain for converting the sense current Is to the sense voltage Vs (input signal Vs) may be the same during each period. In another example, the condition control unit 50 may change both the amplitude of the input signal Vs during each period and the detection threshold Vref. That is, the condition control unit 50 may combine and execute the control example illustrated in FIG. 3 with the control example illustrated in FIG. 4. As an example, the condition control unit 50 may relatively more significantly adjust the sensitivity of the overcurrent detection during each period by the amplitude of the input signal Vs, and may relatively less significantly adjust the sensitivity by the detection threshold Vref. That is, a ratio of the amplitude (that is, the gain to the sense current Is) of the input signal Vs during each period may be higher than a ratio of the detection threshold Vref during each period. Since the detection threshold Vref can be relatively accurately adjusted, the sensitivity of the overcurrent detection can be finely adjusted.

Figure 5:
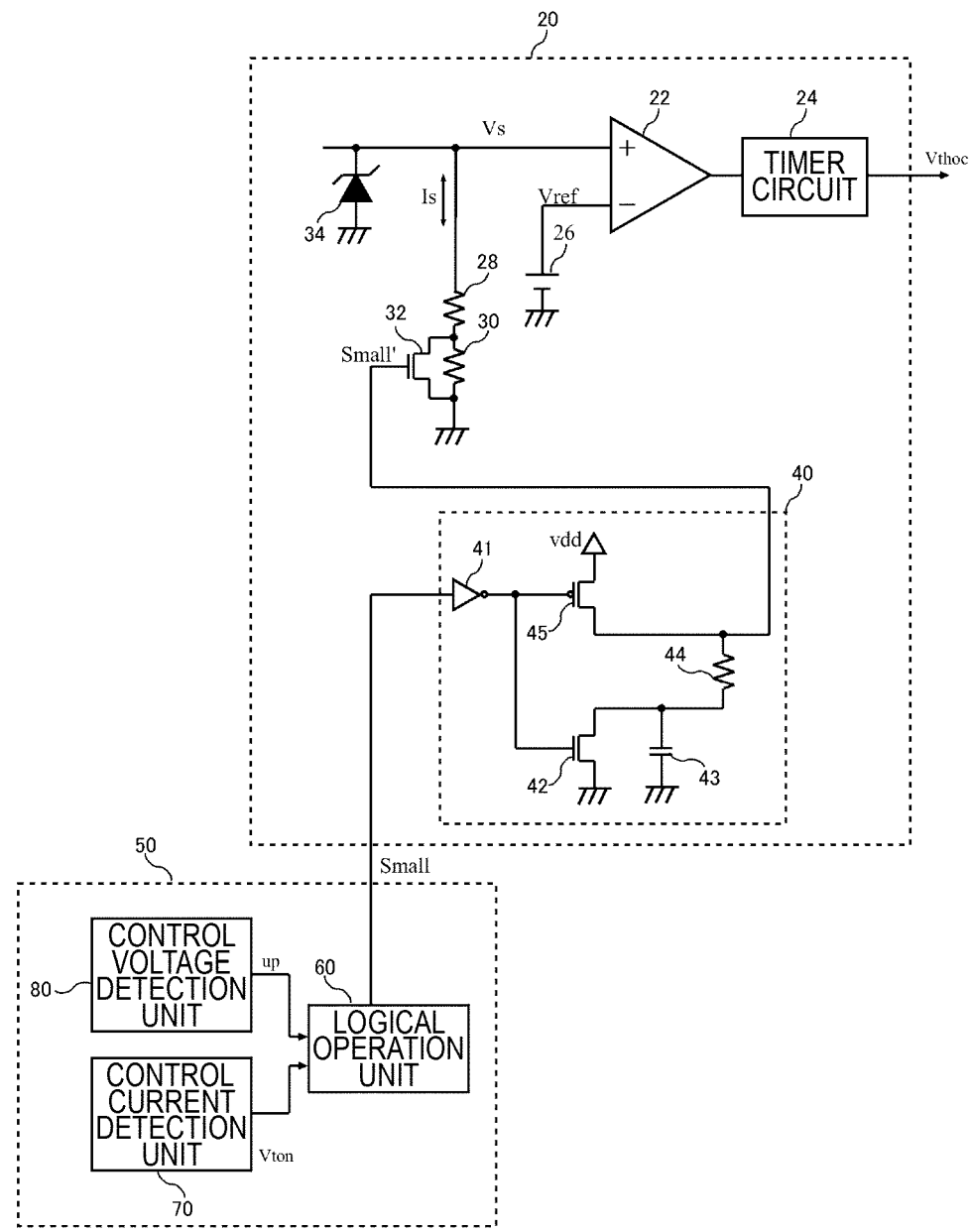
FIG. 5 illustrates an example of a main current detection unit 20 and the condition control unit 50.

FIG. 5 illustrates an example of the main current detection unit 20 and the condition control unit 50. The main current detection unit 20 of the present example has a comparison circuit 22, a power source 26, a resistor 28, a resistor 30, an amplitude adjustment unit 32, a timer circuit 24, and a protection element 34.

The power source 26 is configured to generate the detection threshold Vref. The power source 26 may be a variable power source. In this case, as described in FIG. 4, the condition control unit 50 may set the comparison condition during each period by controlling the power source 26.

The comparison circuit 22 is configured to compare the voltage value of the input signal Vs with the detection threshold Vref to output a comparison result. For example, the comparison circuit 22 may output a signal indicating an H level when the voltage value of the input signal Vs is higher than or equal to the detection threshold Vref, and may output a signal indicating an L level when the voltage value of the input signal Vs is lower than the detection threshold Vref.

The protection element 34 is configured to prevent input of the input signal Vs that is higher than or equal to a predetermined voltage to the comparison circuit 22. The protection element 34 of the present example is a Zener diode connected in a reverse direction between an input terminal (+) to which the input signal Vs is input in the comparison circuit 22 and the reference potential. When the input signal Vs becomes higher than or equal to a predetermined voltage, the protection element 34 electrically connects the input terminal (+) and the reference potential. As a result, the protection element 34 protects the comparison circuit 22.

The resistor 28 and the resistor 30 are configured to generate the input signal Vs from the sense current Is. The resistor 28 and the resistor 30 of the present example are provided in series between the input terminal (+) of the comparison circuit 22 and the reference potential. The sense current Is flows in the resistor 28 and the resistor 30, and the voltage (input signal Vs) according to the sense current Is is generated.

The amplitude adjustment unit 32 is configured to change the amplitude of the input signal Vs. The amplitude adjustment unit 32 of the present example is a transistor which is provided in parallel with the resistor 30 and configured to switch whether the amplitude adjustment unit 32 is caused to be a high resistance to cause the sense current Is to flow in the resistor 30 or the amplitude adjustment unit 32 is caused to be a low resistance to cause the sense current Is to flow in the amplitude adjustment unit 32. An on resistance of the amplitude adjustment unit 32 is sufficiently lower than the resistor 30. By switching on and off of the amplitude adjustment unit 32, a resistance value of the combined resistor in which the sense current Is flows can be changed, and the amplitude of the input signal Vs can be changed. The condition control unit 50 may set the comparison condition during each period by controlling the amplitude adjustment unit 32 as described in FIG. 3. In the present example, an example in which the two resistors and the one switch are used has been described, but by using more resistors and switches, the resistance value of the combined resistor in which the sense current Is flows can be changed to diverse values, and more diverse comparison conditions can be set.

The timer circuit 24 may determine the overcurrent when the comparison circuit 22 continuously outputs, for a predetermined period, a comparison signal indicating that the input signal Vs is higher than or equal to the detection threshold, and output the cutoff signal Vthoc for putting the switching element 131 into the off state. As a result, the switching element 131 and the like can be protected. In addition, since the timer circuit 24 is provided, cutoff of the switching element 131 due to the erroneous detection of the overcurrent which is caused by noise or the like can be suppressed.

The condition control unit 50 has a control current detection unit 70, a control voltage detection unit 80, and a logical operation unit 60. The control current detection unit 70 is configured to detect a control current flowing in the switching element 131. The control current of the present example is the gate current Ig. The control current detection unit 70 may detect whether the control current is higher than or equal to a predetermined current threshold, and output a current detection signal Vton indicating a detection result.

The control voltage detection unit 80 is configured to detect a control voltage applied to the switching element 131. The control voltage of the present example is a voltage of the drive signal drv or the gate voltage Vg. The control voltage detection unit 80 may detect whether the control voltage is higher than or equal to a predetermined voltage threshold, and output a voltage detection signal "up" indicating a detection result.

The logical operation unit 60 is configured to output an amplitude control signal Small based on the current detection signal Vton and the voltage detection signal up. The amplitude control signal Small may be a signal for switching on and off of the amplitude adjustment unit 32. The logical operation unit 60 may detect start timing and end timing of at least one period of the first period T01, the second period T12, or the third period T30 based on the current detection signal Vton and the voltage detection signal up.

In addition, the main current detection unit 20 may further have a buffer circuit 40. The buffer circuit 40 is configured to convert the amplitude control signal Small which is output by the logical operation unit 60, to an amplitude control signal Small' to be input to the amplitude adjustment unit 32. When the buffer circuit 40 is not provided, the logical operation unit 60 may input the amplitude control signal Small to the amplitude adjustment unit 32.

The buffer circuit 40 is configured to moderate a change in the input signal Vs in the case of the shift from the second period T12 to the third period T30. For example, in the example of FIG. 3, the input signal Vs in the case of the shift from the second period T12 to the third period T30 more gradually changes as compared with the input signal Vs in the case of the shift from the first period T01 to the second period T12. As a result, undershoot of the input signal Vs in the case of the shift from the second period T12 to the third period T30 can be suppressed.

The buffer circuit 40 may generate the amplitude control signal Small' obtained by reducing a high frequency component of the amplitude control signal Small in the case of the shift from the second period T12 to the third period T30. The buffer circuit 40 of the present example has an inverter 41, a pMOS transistor 45, an nMOS transistor 42, a capacitance 43, and a resistor 44. The inverter 41 is configured to output a signal obtained by inverting logical patterns (that is, transition patterns at the H level and the L level) of the amplitude control signal Small.

The pMOS transistor 45, the resistor 44, and the nMOS transistor 42 are provided in series in the stated order between a predetermined high potential vdd and the ground potential. The capacitance 43 is provided between a connection point of the nMOS transistor 42 and the resistor 44, and the ground potential. In addition, a potential at a connection point of the pMOS transistor 45 and the resistor 44 is input to the amplitude adjustment unit 32 as the amplitude control signal Small'.

According to the present example, when the amplitude control signal Small turns to the H level, the pMOS transistor 45 is put into the on state, and the nMOS transistor 42 is put into the off state. As a result, the buffer circuit 40 outputs the amplitude control signal Small' according to the high potential vdd.

In addition, when the amplitude control signal Small turns to the L level, the pMOS transistor 45 is put into the off state, and the nMOS transistor 42 is put into the on state. As a result, the buffer circuit 40 outputs the amplitude control signal Small' according to the ground potential. Note that when the nMOS transistor 42 turns to the on state and transition of the amplitude control signal Small' from the H level to the L level occurs, a high frequency component of the amplitude control signal Small' flows to the ground potential via the capacitance 43. As a result, the high frequency component of the amplitude control signal Small' in the case of the shift from the second period T12 to the third period T30 can be reduced to moderate the change in the input signal Vs.

Figure 6:
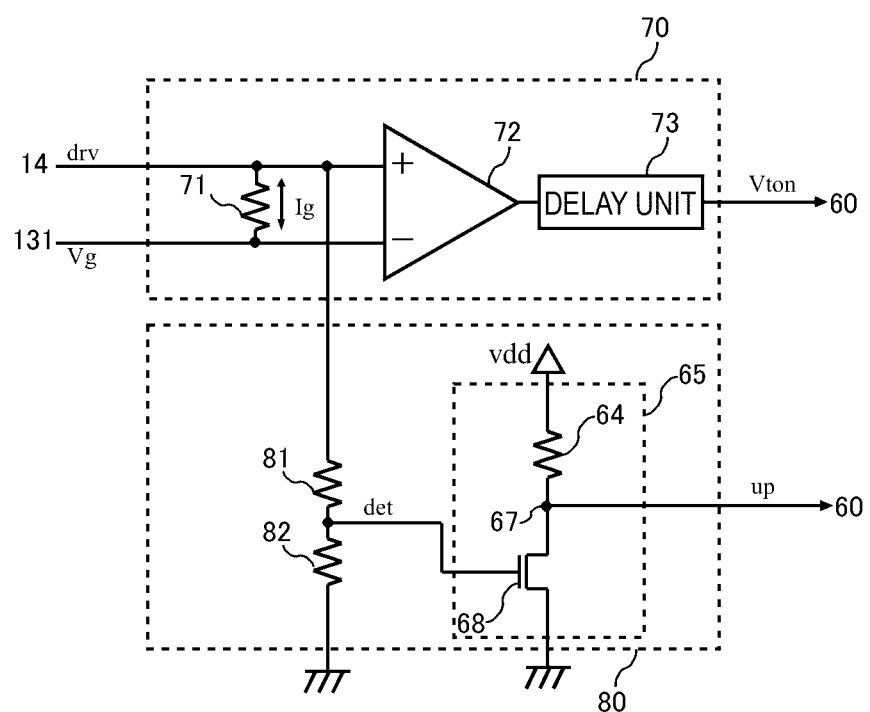
FIG. 6 illustrates an example of a control current detection unit 70 and a control voltage detection unit 80.

FIG. 6 illustrates an example of the control current detection unit 70 and the control voltage detection unit 80. The control current detection unit 70 has a control resistor 71, a first comparison unit 72, and a delay unit 73. The control resistor 71 is a resistor provided between the control circuit 14 and the gate terminal G of the switching element 131, through which the control current (gate current Ig) passes.

The first comparison unit 72 is configured to compare voltages at both ends of the control resistor 71, and output a current detection signal based on a comparison result. The first comparison unit 72 may output the current detection signal Vton indicating the H level when the voltages at both ends of the control resistor 71 become higher than or equal to a predetermined current threshold and indicating the L level when the voltages at both ends are lower than the current threshold. As a result, the first comparison unit 72 detects timing at which the control current has started to flow, that is, the clock time T0 at which the switching element 131 has turned on.

The delay unit 73 is configured to delay the current detection signal Vton output by the first comparison unit 72 by a predetermined delay time period, and output the current detection signal to the logical operation unit 60. The delay time period in the delay unit 73 is the same as a length (T1-T0) of the first period T01. The condition control unit 50 sets a period, as the first period T01, since it is detected that the control current has started to flow in the switching element 131 until the delay time period in the delay unit 73 elapses. For the setting of the delay time period of the delay unit 73, first, an actually measured waveform of the input signal Vs at each of the time of short circuit and the time of non-short circuit of the switching element 131. Then, an end point of the first period T01 is set to be timing between timing at which the input signal Vs upon short circuit becomes a detection threshold Vref and timing at which the input signal Vs upon non-short circuit becomes the detection threshold Vref.

The control voltage detection unit 80 has a first voltage division resistor 81, a first voltage division resistor 82, and a second comparison unit 65. The first voltage division resistor 81 and the first voltage division resistor 82 are configured to output a voltage division signal det obtained by dividing the control voltage. The first voltage division resistor 81 and the first voltage division resistor 82 of the present example are provided in series between any input terminal of the first comparison unit 72 and the reference potential. In the example of FIG. 6, the first voltage division resistor 81 and the first voltage division resistor 82 are provided between the input terminal (+) to which the drive signal drv is input in the first comparison unit 72 and the reference potential. In this case, the first voltage division resistor 81 and the first voltage division resistor 82 divide and output the drive signal drv. In another example, the first voltage division resistor 81 and the first voltage division resistor 82 may be provided between an input terminal (−) to which the gate voltage Vg is input in the first comparison unit 72 and the reference potential. In this case, the first voltage division resistor 81 and the first voltage division resistor 82 divide and output the gate voltage Vg.

The second comparison unit 65 is configured to detect whether the control voltage is higher than or equal to a predetermined voltage threshold based on the voltage division signal det. The second comparison unit 65 outputs the voltage detection signal up indicating the detection result. The second comparison unit 65 of the present example has a resistor 64 and a MOS transistor 68. The resistor 64 is arranged between the predetermined high potential and the MOS transistor 68. The MOS transistor 68 is arranged between the resistor 64 and a predetermined low potential (for example, the reference potential). The second comparison unit 65 outputs a potential at a connection point 67 of the MOS transistor 68 and the resistor 64 to the logical operation unit 60 as the voltage detection signal up.

The voltage division signal det is input to a gate terminal of the MOS transistor 68. The MOS transistor 68 is put into the on state when the voltage division signal det is higher than or equal to a threshold voltage of the MOS transistor 68. In this case, the connection point 67 is connected to the reference potential, and a potential of the voltage detection signal up is set to the L level. When the voltage division signal det is lower than or equal to the threshold voltage of the MOS transistor 68, the MOS transistor 68 is put into the off state. In this case, the potential of the voltage detection signal up is set as the H level.

By adjusting the threshold voltage of the MOS transistor 68, it is possible to detect that the control voltage approaches a steady state. The steady state refers to a state where after the drive signal dry for turning off the switching element 131 is output, the control voltage converges to a certain value.

Figure 7:
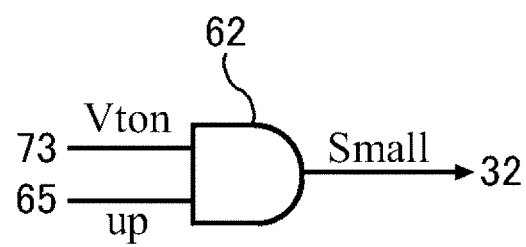
FIG. 7 illustrates a configuration example of a logical operation unit 60.

FIG. 7 illustrates a configuration example of the logical operation unit 60. The logical operation unit 60 decides a length of the second period T12 based on both a control voltage and a control current which are to be applied to the switching element 131. Based on at least one of the control voltage or the control current, the logical operation unit 60 may decide a length of the first period T01, or may decide a length of the third period T30. The logical operation unit 60 of the present example has a logical product circuit 62.

The logical product circuit 62 is configured to output the amplitude control signal Small corresponding to a logical product of the current detection signal Vton and the voltage detection signal up to the amplitude adjustment unit 32. As a result, the logical product circuit 62 controls the length of each period based on the current detection signal Vton and the voltage detection signal up. For example, when the current detection signal Vton and the voltage detection signal up are input, the control current is higher than or equal to the current threshold, and also the control voltage is lower than the voltage threshold, the logical product circuit 62 sets the comparison condition in the main current detection unit 20 to the second condition and starts the second period T12. In addition, when at least one of conditions is satisfied on whether the control current becomes lower than the current threshold or whether the control voltage becomes higher than or equal to the voltage threshold, the logical product circuit 62 changes the comparison condition in the main current detection unit 20 from the second condition to the third condition and starts the third period T30.

Figure 8:
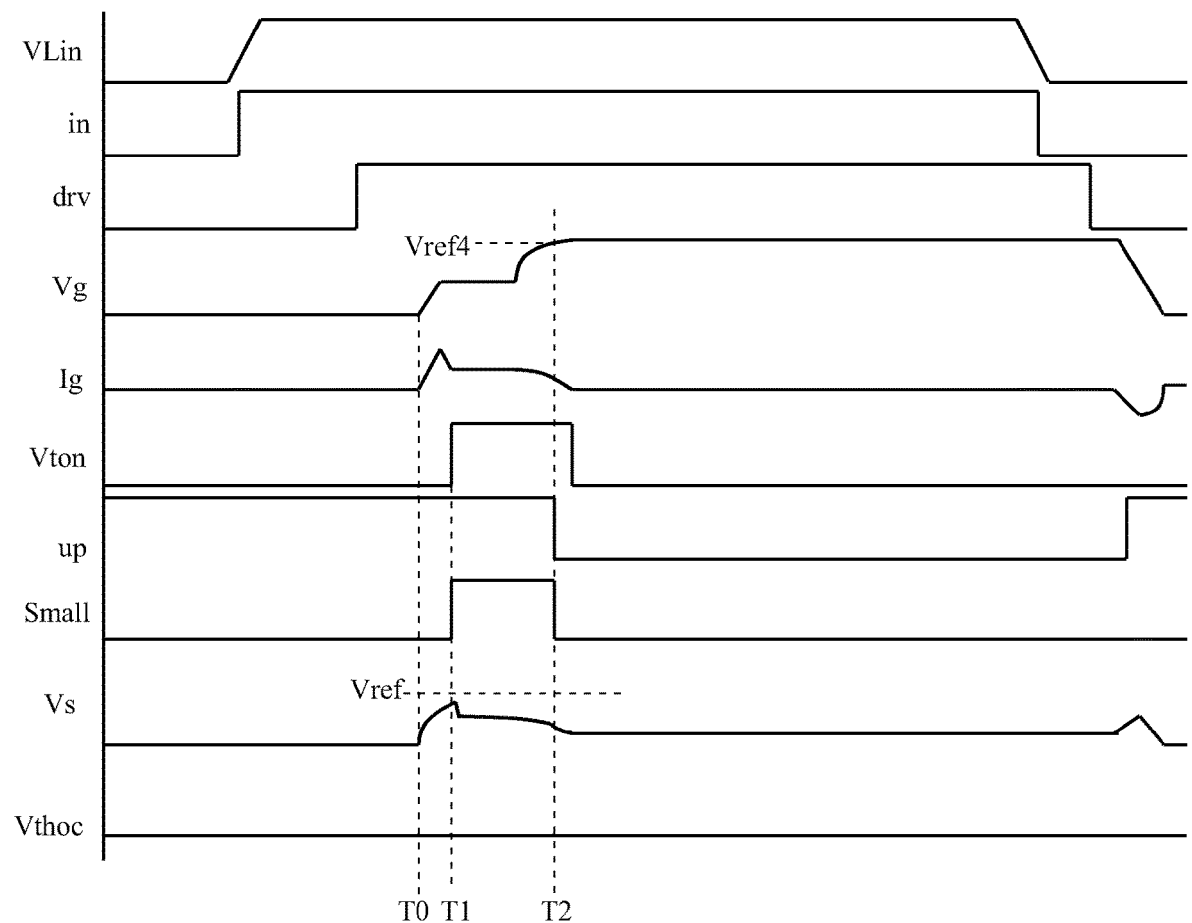
FIG. 8 is a timing chart illustrating an operation example of a drive circuit 10.

FIG. 8 is a timing chart illustrating an operation example of the drive circuit 10. When the switching element 131 is to turn on, the transition of the first control signal VLin from the L level to the H level occurs. Along with this, the transition of the second control signal in from the L level to the H level also occurs. In addition, the transition of the drive signal dry from the L level to the H level also occurs.

After the transition of the drive signal dry to the H level occurs, the gate current Ig for charging a gate capacitance or the like of the switching element 131 flows, and the gate voltage Vg of the switching element 131 gradually increases. The control current detection unit 70 senses that the gate current Ig has started to flow (clock time T0). In addition, the current detection signal Vton output by the control current detection unit 70 is delayed according to the length of the first period T01 by the delay unit 73. For this reason, the transition of the current detection signal Vton from the L level to the H level occurs at a clock time T1 delayed from the clock time T0. Note that during the first period T01 from the clock time T0 to the clock time T1, since the gate voltage Vg is lower than a voltage threshold Vref4, the voltage detection signal up output by the control voltage detection unit 80 is the H level.

The amplitude control signal Small output by the logical operation unit 60 is a logical product of the current detection signal Vton and the voltage detection signal up. For this reason, during the first period T01, the amplitude control signal Small is the L level. Therefore, the amplitude adjustment unit 32 illustrated in FIG. 5 is put into the off state, and the amplitude of the input signal Vs becomes an amplitude (that is, the amplitude under the first condition) according to a combined resistor value of the resistor 28 and the resistor 30.

When the transition of the current detection signal Vton to the H level occurs at the clock time T1, the transition of the amplitude control signal Small to the H level also occurs. Therefore, the amplitude adjustment unit 32 is put into the on state, and the amplitude of the input signal Vs becomes an amplitude (that is, the amplitude under the second condition) according to the resistance value of the resistor 28. As a result, the first period T01 ends, and the second period T12 starts.

Next, when the gate voltage Vg becomes higher than or equal to the voltage threshold Vref4 (clock time T2), the transition of the voltage detection signal up to the L level occurs. Therefore, the amplitude adjustment unit 32 is put into the off state, and the amplitude of the input signal Vs becomes an amplitude (that is, the amplitude under the third condition=the first condition) according to the combined resistor value of the resistor 28 and the resistor 30. As a result, the second period T12 ends, and the third period T30 starts.

Note that it is also conceivable to define the second period T12 based on only the current detection signal Vton. That is, it is also conceivable to set a period in which the current detection signal Vton is the H level as the second period T12. On the other hand, when the gate current Ig is minute, the voltages at both ends of the control resistor 71 decrease, and there may be a case where it is not possible to sense the change in the gate current Ig. In the present example, the second period T12 is defined based on both the current detection signal Vton and the voltage detection signal up. That is, the condition control unit 50 sets a period in which the gate current Ig is higher than or equal to the current threshold and also the gate voltage Vg is lower than the voltage threshold Vref4 as the second period. For this reason, even when the gate current Ig is low, the end of the second period T12 (that is, the end of the transient period) can be accurately detected.

According to the present example, while the overcurrent detection sensitivity during the second period T12 is reduced, the high overcurrent detection sensitivity during the first period T01 can be maintained. For this reason, the overcurrent upon short circuit during the first period T01 can be detected, and also the erroneous detection of the overcurrent during the second period T12 can be suppressed. In addition, since the overcurrent detection sensitivity during the third period T30 can be increased, the overcurrent in the steady state can be more likely to be detected.

Figure 9:
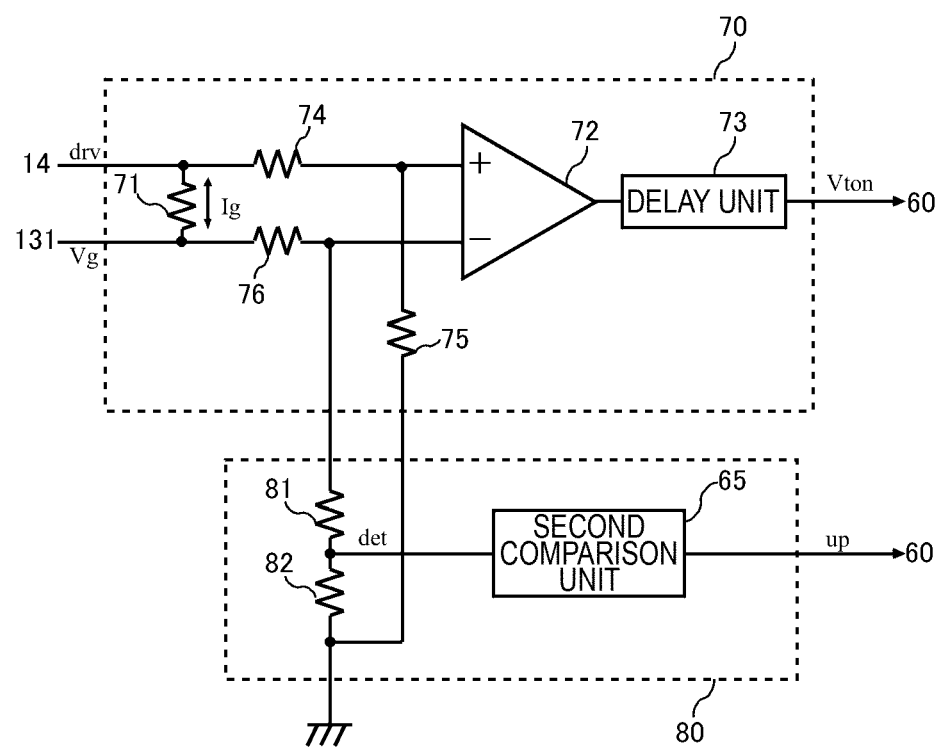
FIG. 9 illustrates another configuration example of the control current detection unit 70.

FIG. 9 illustrates another configuration example of the control current detection unit 70. The control current detection unit 70 of the present example further has a second voltage division resistor 74, a second voltage division resistor 75, and a third voltage division resistor 76 in addition to the configuration of the control current detection unit 70 of any aspect described in FIG. 1 to FIG. 8. The second voltage division resistor 74 and the second voltage division resistor 75 are provided in series between one end (in FIG. 9, an end on the control circuit 14 side) of the control resistor 71 and the reference potential, and are configured to divide a voltage at the end of the control resistor 71 (in FIG. 9, the voltage of the drive signal dry). The second voltage division resistor 74 and the second voltage division resistor 75 input the divided voltage to a terminal (in FIG. 9, a + terminal) of the first comparison unit 72.

In addition, the third voltage division resistor 76 is provided together with another third voltage division resistor in series between another end (in FIG. 9, an end on the switching element 131 side) of the control resistor 71 and the reference potential, and is configured to divide a voltage (in FIG. 9, the gate voltage Vg) at the end of the control resistor 71. In the example of FIG. 9, a combined resistor of the first voltage division resistor 81 and the first voltage division resistor 82 functions as the other third voltage division resistor. That is, the third voltage division resistor 76, the first voltage division resistor 81, and the first voltage division resistor 82 are connected in series. The third voltage division resistor 76 inputs the divided voltage to a terminal (in FIG. 9, a − terminal) of the first comparison unit 72. In addition, a voltage at a connection point of the third voltage division resistor 76 and the first voltage division resistor 81 is applied to the − terminal of the first comparison unit 72.

According to the present example, each of the voltages at both ends of the control resistor 71 can be divided at a predetermined resistance ratio to be input to the first comparison unit 72. For this reason, even when a power source voltage of the first comparison unit 72 is lower than the drive signal dry, the first comparison unit 72 can detect the voltages at both ends of the control resistor 71.

Each of the voltage division resistors preferably has a resistance value sufficiently higher than the control resistor 71. The resistance value of the voltage division resistor may be 1000 times or more, or may be 10000 times or more, as high as the control resistor 71. As a result, an influence to the gate current Ig due to the provision of the voltage division resistors can be reduced.

The resistance values of the first voltage division resistor 81, the first voltage division resistor 82, the second voltage division resistor 74, the second voltage division resistor 75, and the third voltage division resistor 76 are respectively set as R81, R82, R74, R75, and R76. A resistance ratio (R74/R75) of the second voltage division resistor 74 to the second voltage division resistor 75 is preferably slightly different from a resistance ratio (R76/(R81+R82)) of the third voltage division resistor 76 in the present example. As a result, an hysteresis operation of the first comparison unit 72 can be realized, and the output of the first comparison unit 72 can be stabilized. A difference of the resistance ratios may be 10% or less.

Figure 10:
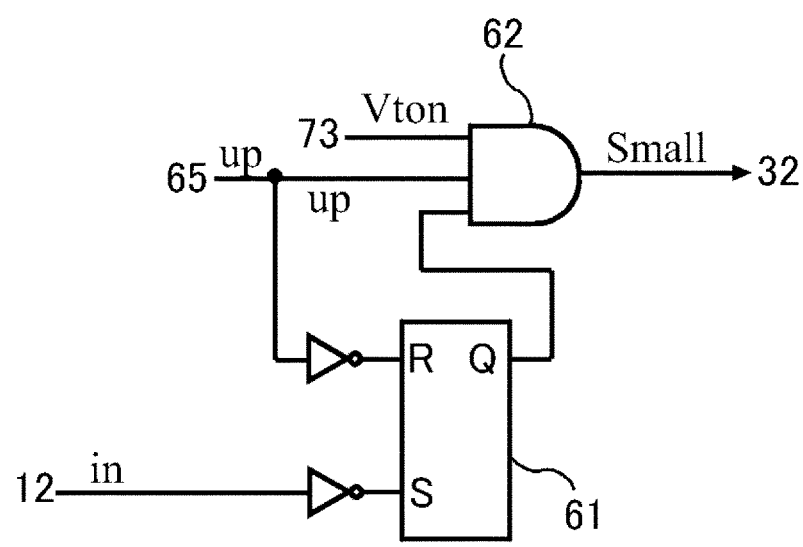
FIG. 10 illustrates another configuration example of the logical operation unit 60.

FIG. 10 illustrates another configuration example of the logical operation unit 60. The logical operation unit 60 of the present example further has a condition maintaining unit 61 in addition to the configuration of the logical operation unit 60 of any aspect described in FIG. 1 to FIG. 9. After the condition control unit 50 sets the third condition in the main current detection unit 20, the condition maintaining unit 61 is configured to maintain the third condition until a signal for turning off the switching element 131 is detected. The condition maintaining unit 61 of the present example detects the second control signal in as the signal for turning off the switching element 131, but may detect the first control signal VLin, the drive signal dry, or the like instead of the second control signal in.

The condition maintaining unit 61 of the present example is a set-reset latch circuit in which an inverted signal of the second control signal in is input to a set terminal S, an inverted signal of the voltage detection signal up is input to a reset terminal R, and an output terminal Q is connected to an input terminal of the logical product circuit 62. That is, the condition maintaining unit 61 outputs the H level to the logical product circuit 62 from the transition of the second control signal in to the L level until the transition of the voltage detection signal up to the L level. During another period, the condition maintaining unit 61 outputs the L level to the logical product circuit 62, and fixes the condition control signal Small to the L level.

With the provision of the condition maintaining unit 61, after the third period T30 has started, the erroneous start of the second period T12 due to noise or the like can be suppressed. For this reason, the overcurrent during the third period T30 can be accurately detected.

Figure 11:
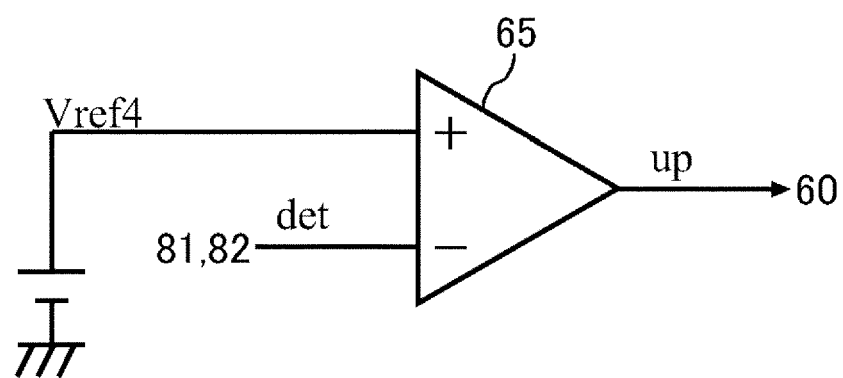
FIG. 11 illustrates another configuration example of a second comparison unit 65.

FIG. 11 illustrates another configuration example of the second comparison unit 65. The second comparison unit 65 of the present example is a comparison circuit in which the voltage threshold Vref4 is input to the + terminal, the voltage division signal det is input to the − terminal, and the voltage detection signal up according to a difference between the voltage threshold Vref4 and the voltage division signal det is output. With such a configuration too, the voltage detection signal up can be generated. The second comparison unit 65 illustrated in FIG. 11 can be applied to each embodiment of the present specification.

Figure 12:
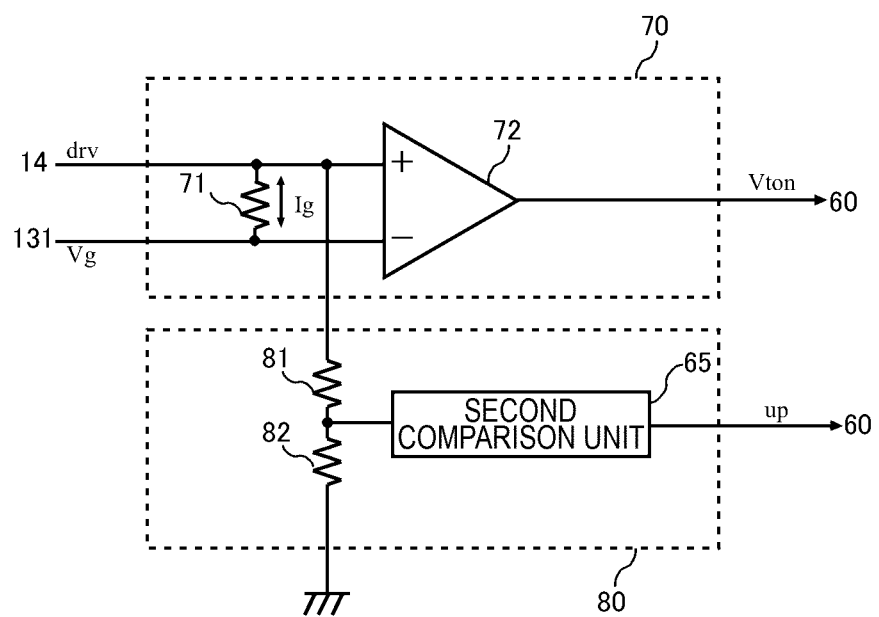
FIG. 12 illustrates another configuration example of the control current detection unit 70.

FIG. 12 illustrates another configuration example of the control current detection unit 70. The control current detection unit 70 of the present example is different from the control current detection unit 70 illustrated in FIG. 6 in that the delay unit 73 is not included. The other configuration is similar to the example of FIG. 6. When the control current detection unit 70 of the present example is used, a circuit in a subsequent stage such as the logical operation unit 60 may have the delay unit 73.

Figure 13:
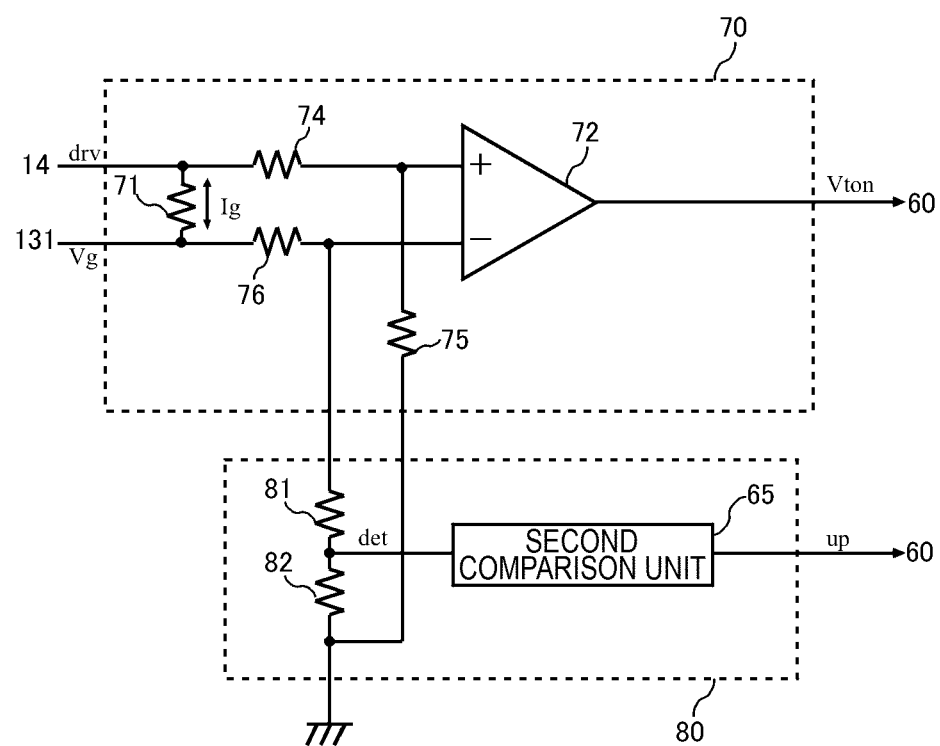
FIG. 13 illustrates another configuration example of the control current detection unit 70.

FIG. 13 illustrates another configuration example of the control current detection unit 70. The control current detection unit 70 of the present example is different from the control current detection unit 70 illustrated in FIG. 9 in that the delay unit 73 is not included. The other configuration is similar to the example of FIG. 9. When the control current detection unit 70 of the present example is used, a circuit in a subsequent stage such as the logical operation unit 60 may have the delay unit 73.

Figure 14:
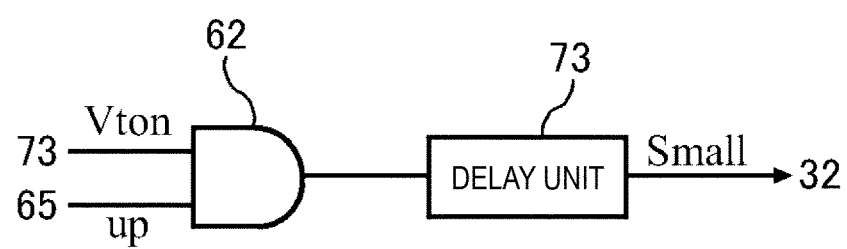
FIG. 14 illustrates another configuration example of the logical operation unit 60.

FIG. 14 illustrates another configuration example of the logical operation unit 60. The logical operation unit 60 of the present example is different from the logical operation unit 60 of FIG. 7 in that the delay unit 73 configured to delay the output of the logical product circuit 62 is included. The logical operation unit 60 of the present example is used in combination with the control current detection unit 70 described in FIG. 12 or FIG. 13. An amount of delay of the delay unit 73 is the same as the length of the first period T01. With such a configuration too, similarly as in the examples of FIG. 1 to FIG. 11, the comparison condition in the main current detection unit 20 in each period can be set.

Figure 15:
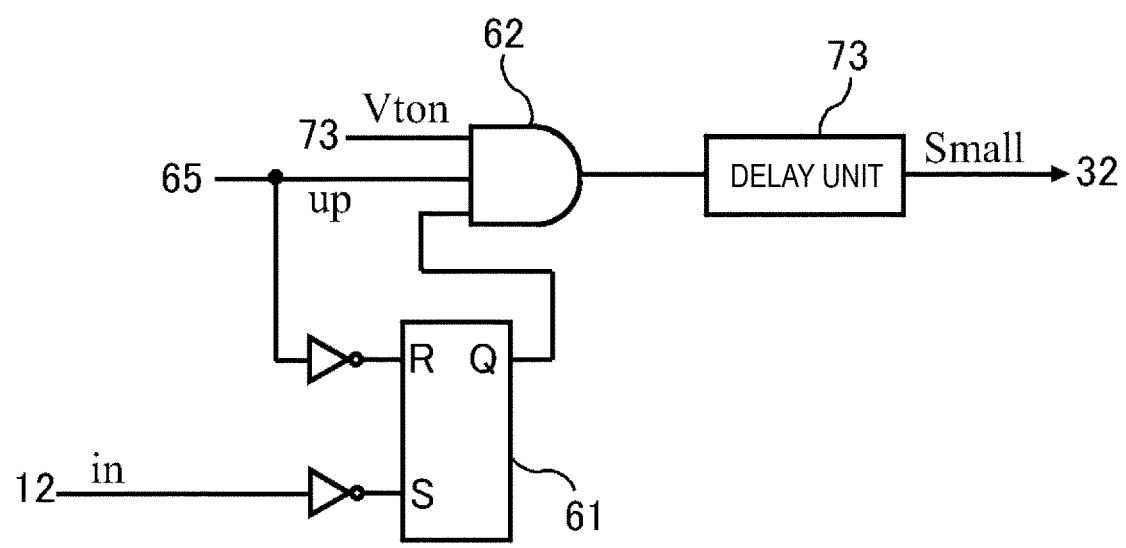
FIG. 15 illustrates another configuration example of the logical operation unit 60.

FIG. 15 illustrates another configuration example of the logical operation unit 60. The logical operation unit 60 of the present example is different from the logical operation unit 60 of FIG. 10 in that the delay unit 73 configured to delay the output of the logical product circuit 62 is included. The logical operation unit 60 of the present example is used in combination with the control current detection unit 70 described in FIG. 12 or FIG. 13. The amount of delay of the delay unit 73 is the same as the length of the first period T01. With such a configuration too, similarly as in the examples of FIG. 1 to FIG. 11, the comparison condition in the main current detection unit 20 in each period can be set.

Figure 16:
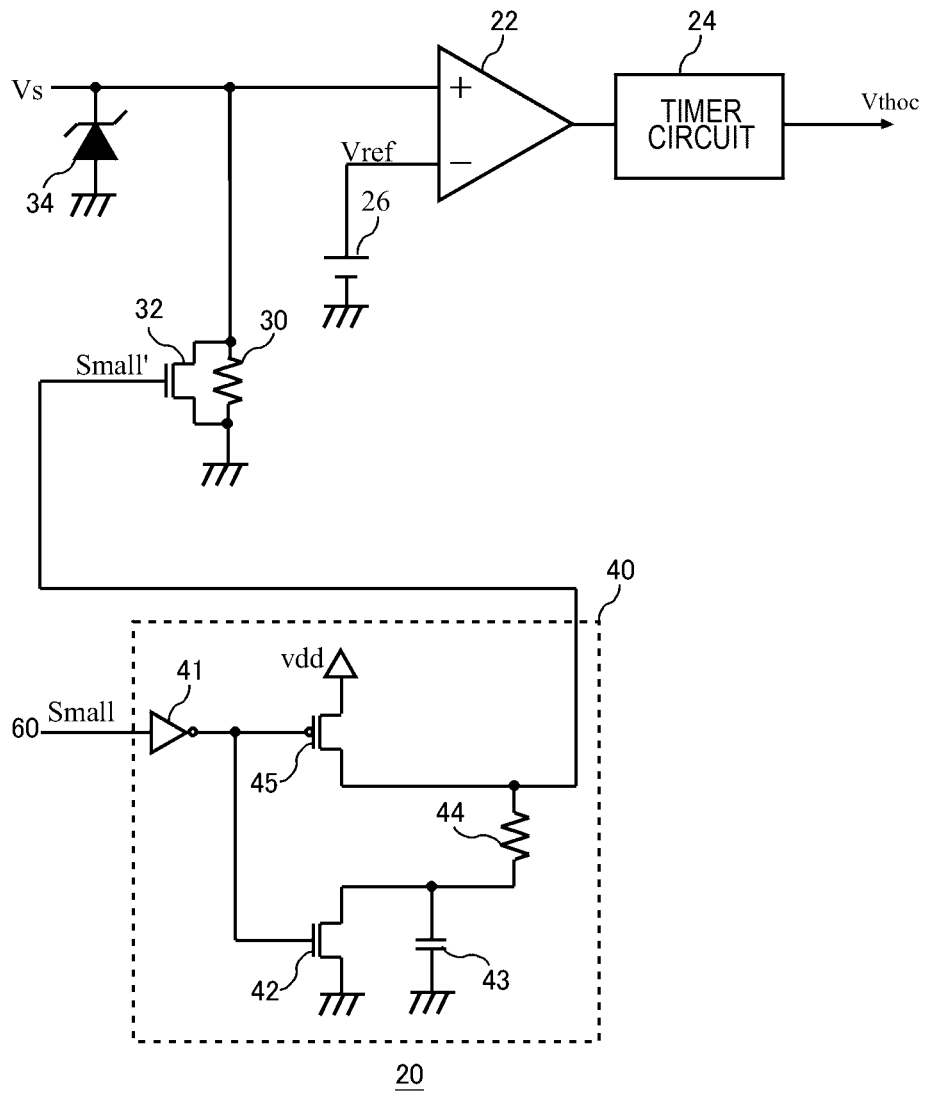
FIG. 16 illustrates another configuration example of the main current detection unit 20.

FIG. 16 illustrates another configuration example of the main current detection unit 20. The main current detection unit 20 of the present example is different from the main current detection unit 20 illustrated in FIG. 5 in that the resistor 28 is not included. The other configuration is similar to the example of FIG. 5.

In the present example, when the amplitude adjustment unit 32 is in the off state (the first condition and the third condition), the amplitude of the input signal Vs is set by the gate current Ig and the resistance value of the resistor 30. On the other hand, when the amplitude adjustment unit 32 is in the on state (the second condition), the amplitude of the input signal Vs is set by the gate current Ig and the on resistance of the amplitude adjustment unit 32. The on resistance of the amplitude adjustment unit 32 can be adjusted by a concentration or the like of an impurity injected into a semiconductor substrate. With such a configuration too, the amplitude of the input signal Vs during each period can be adjusted. Note that similarly as in the example of FIG. 5, the main current detection unit 20 may or may not have the buffer circuit 40.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

EXPLANATION OF REFERENCES

10: drive circuit, 12: input circuit, 14: control circuit, 20: main current detection unit, 22: comparison circuit, 24: timer circuit, 26: power source, 28: resistor, 30: resistor, 32: amplitude adjustment unit, 34: protection element, 40: buffer circuit, 41: inverter, 42: nMOS transistor, 43: capacitance, 44: resistor, 45: pMOS transistor, 50: condition control unit, 60: logical operation unit, 61: condition maintaining unit, 62: logical product circuit, 64: resistor, 65: second comparison unit, 67: connection point, 68: MOS transistor, 70: control current detection unit, 71: control resistor, 72: first comparison unit, 73: delay unit, 74, 75: second voltage division resistor, 76: third voltage division resistor, 80: control voltage detection unit, 81, 82: first voltage division resistor, 100: power supply circuit, 110: drive circuit, 130, 131: switching element, 140: power source, 200: overcurrent detection circuit, 300: load

What is claimed is:

1. An overcurrent detection circuit for detecting an overcurrent flowing upon turning on of a switching element, the overcurrent detection circuit comprising:
    a main current detection unit configured to detect whether an input signal according to a main current flowing in the switching element is higher than or equal to a set detection threshold; and
    a condition control unit configured to control at least one of a waveform of the input signal in the main current detection unit or the detection threshold to control a comparison condition in the main current detection unit, wherein
    the condition control unit is configured to set the comparison condition to a first condition during a period from the turning on of the switching element until elapse of a first period, and set the comparison condition to a second condition under which the input signal is less likely to be higher than or equal to the detection threshold as compared with the first condition during a period from the elapse of the first period until elapse of a second period,
    the condition control unit is configured to set the comparison condition to a third condition under which the input signal is more likely to be higher than or equal to the detection threshold as compared with the second condition after the elapse of the second period, and
    the first condition is a condition under which the input signal is more likely to be higher than or equal to the detection threshold as compared with the third condition.

2. The overcurrent detection circuit according to claim 1, wherein the first condition and the third condition are the same.

3. The overcurrent detection circuit according to claim 1, wherein
    the second period continues up to timing at which a control current flowing in the switching element that is not in a short circuit state converges to a steady state value or later than the timing.

4. The overcurrent detection circuit according to claim 1, wherein
    the condition control unit is configured to decide a length of the second period based on both a control voltage and a control current which are applied to the switching element.

5. The overcurrent detection circuit according to claim 1, further comprising:
    a timer circuit configured to output, when the main current detection unit continuously outputs a comparison signal indicating that the input signal is higher than or equal to the detection threshold for a predetermined period, a control signal for turning off the switching element.

6. A drive circuit comprising:
    the overcurrent detection circuit according to claim 1; and
    a control circuit configured to control an on state or an off state of the switching element.

7. An overcurrent detection circuit for detecting an overcurrent flowing upon turning on of a switching element, the overcurrent detection circuit comprising:

a main current detection unit configured to detect whether an input signal according to a main current flowing in the switching element is higher than or equal to a set detection threshold; and a condition control unit configured to control at least one of a waveform of the input signal in the main current detection unit or the detection threshold to control a comparison condition in the main current detection unit, wherein the condition control unit is configured to set the comparison condition to a first condition during a period from the turning on of the switching element until elapse of a first period, and set the comparison condition to a second condition under which the input signal is less likely to be higher than or equal to the detection threshold as compared with the first condition during a period from the elapse of the first period until elapse of a second period, and the first period is longer than or equal to a time period since the turning on of the switching element in a short circuit state until the input signal reaches the detection threshold under the first condition.

8. An overcurrent detection circuit for detecting an overcurrent flowing upon turning on of a switching element, the overcurrent detection circuit comprising:

a main current detection unit configured to detect whether an input signal according to a main current flowing in the switching element is higher than or equal to a set detection threshold; and a condition control unit configured to control at least one of a waveform of the input signal in the main current detection unit or the detection threshold to control a comparison condition in the main current detection unit, wherein the condition control unit is configured to set the comparison condition to a first condition during a period from the turning on of the switching element until elapse of a first period, and set the comparison condition to a second condition under which the input signal is less likely to be higher than or equal to the detection threshold as compared with the first condition during a period from the elapse of the first period until elapse of a second period, the condition control unit is configured to decide a length of the second period based on both a control voltage and a control current which are applied to the switching element, and the condition control unit is configured to set, as the second period, a period in which the control current is higher than or equal to a current threshold and also the control voltage is lower than a voltage threshold.

9. The overcurrent detection circuit according to claim 8, wherein the condition control unit has a control current detection unit configured to detect whether the control current is higher than or equal to the current threshold, and output a current detection signal according to a detection result, and a delay unit configured to delay the current detection signal.

10. The overcurrent detection circuit according to claim 9, wherein the condition control unit further has a control voltage detection unit configured to detect whether the control voltage is higher than or equal to the voltage threshold, and output a voltage detection signal according to a detection result, and a logical operation unit configured to set the comparison condition to the second condition when the current detection signal and the voltage detection signal are input, the control current is higher than or equal to the current threshold, and also the control voltage is lower than the voltage threshold, and set the comparison condition to a third condition under which the input signal is more likely to be higher than or equal to the detection threshold as compared with the second condition when at least one of conditions is satisfied on whether the control current becomes lower than the current threshold or whether the control voltage becomes higher than or equal to the voltage threshold.

11. The overcurrent detection circuit according to claim 10, further comprising:

a condition maintaining unit configured to maintain the third condition until a signal for turning off the switching element is detected after the condition control unit sets the third condition.

12. The overcurrent detection circuit according to claim 10, further comprising:

an amplitude adjustment unit configured to adjust an amplitude of the input signal based on a detection result of the logical operation unit.

13. The overcurrent detection circuit according to claim 10, wherein the control current detection unit has a control resistor through which the control current passes, and a first comparison unit configured to compare voltages at both ends of the control resistor, and output the current detection signal based on a comparison result.

14. The overcurrent detection circuit according to claim 13, wherein the control voltage detection unit has a first voltage division resistor provided in series between either end of the control resistor and a reference potential, and configured to divide the control voltage, and a second comparison unit configured to compare the control voltage divided by the first voltage division resistor with the voltage threshold.

15. The overcurrent detection circuit according to claim 13, wherein the control current detection unit further has a second voltage division resistor provided in series between one end of the control resistor and a reference potential, and configured to divide a voltage at the one end of the control resistor to be input to the first comparison unit, and a third voltage division resistor provided in series between another end of the control resistor and the reference potential, and configured to divide a voltage at the other end of the control resistor to be input to the first comparison unit.

16. The overcurrent detection circuit according to claim 15, wherein a resistance ratio in the second voltage division resistor is different from a resistance ratio in the third voltage division resistor.

17. An overcurrent detection circuit for detecting an overcurrent flowing upon turning on of a switching element, the overcurrent detection circuit comprising:

a main current detection unit configured to detect whether an input signal according to a main current flowing in the switching element is higher than or equal to a set detection threshold; and a condition control unit configured to control at least one of a waveform of the input signal in the main current detection unit or the detection threshold to control a comparison condition in the main current detection unit, wherein the condition control unit is configured to set the comparison condition to a first condition during a period from the turning on of the switching element until elapse of a first period, and set the comparison condition to a second condition under which the input signal is less likely to be higher than or equal to the detection threshold as compared with the first condition during a period from the elapse of the first period until elapse of a second period, and the first period is longer than or equal to a time period since the turning on of the switching element in a short circuit state until the input signal reaches a maximum value under the first condition.

* * * * *